(12) United States Patent
Tu et al.

(10) Patent No.: US 7,679,146 B2
(45) Date of Patent: *Mar. 16, 2010

(54) SEMICONDUCTOR DEVICE HAVING SUB-SURFACE TRENCH CHARGE COMPENSATION REGIONS

(75) Inventors: Shanghui Larry Tu, Phoenix, AZ (US); Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 482 days.

This patent is subject to a terminal disclaimer.

(21) Appl. No.: 11/442,706

(22) Filed: May 30, 2006

(65) Prior Publication Data

US 2007/0278565 A1 Dec. 6, 2007

(51) Int. Cl.
*H01L 27/088* (2006.01)
(52) U.S. Cl. ............... 257/401; 257/493; 257/E21.418; 438/274
(58) Field of Classification Search ........... 257/204, 257/E27.062–E27.067, E27.108, 213–413, 257/E29.256–E29.261, 901–903, E29.233, 257/E29.27, E21.537–E21.539, 900, E21.19–E21.21, 257/E21.394–E21.458, E21.615–E21.694, 257/135–136, E27.091, E27.095–E27.096, 257/E29.2, E29.118, E29.274, E29.313, E29.318, 257/E29.262, E29.201, E29.26, E29.655; 438/270–273, 589, 137, 138, 146, 175, 257, 438/153, 188, 199–233, 135, 142, 292–308, 438/136, 156, 173, 192

See application file for complete search history.

(56) References Cited

U.S. PATENT DOCUMENTS

| | | |
|---|---|---|
| 5,216,275 A | 6/1993 | Chen |
| 5,438,215 A | 8/1995 | Tihanyi |
| 5,872,421 A | 2/1999 | Potter |
| 5,998,288 A | 12/1999 | Gardner et al. |
| 6,184,555 B1 * | 2/2001 | Tihanyi et al. ............... 257/342 |
| 6,191,446 B1 | 2/2001 | Gardner et al. |
| 6,210,999 B1 | 4/2001 | Gardner et al. |
| 6,255,152 B1 | 7/2001 | Chen |
| 6,274,904 B1 | 8/2001 | Tihanyi |
| 6,278,165 B1 | 8/2001 | Oowaki et al. |

(Continued)

FOREIGN PATENT DOCUMENTS

WO    WO 2006/025035    * 3/2006

(Continued)

OTHER PUBLICATIONS

"A Novel Trench Concept for the Fabrication of Compensation Devices," M. Rub, D. Ahlers, J. Baumgartl, G. Deboy, W. Friza, O. Haberlen andl. Steinigke, pp. 203-206., ISPSD 2003, April $14^{th}$-17, Cambridge, UK.

*Primary Examiner*—W. David Coleman
*Assistant Examiner*—Maliheh Malek
(74) *Attorney, Agent, or Firm*—Kevin B. Jackson

(57) ABSTRACT

In one embodiment, a semiconductor device is formed having sub-surface charge compensation regions in proximity to channel regions of the device. The charge compensation trenches comprise at least two opposite conductivity type semiconductor layers. A channel connecting region electrically couples the channel region to one of the at least two opposite conductivity type semiconductor layers.

19 Claims, 12 Drawing Sheets

U.S. PATENT DOCUMENTS

| | | | |
|---|---|---|---|
| 6,355,955 B1 | 3/2002 | Gardner et al. | |
| 6,410,955 B1 | 6/2002 | Baker et al. | |
| 6,465,869 B2 * | 10/2002 | Ahlers et al. | 257/548 |
| 6,479,352 B2 | 11/2002 | Blanchard | |
| 6,509,240 B2 | 1/2003 | Ren et al. | |
| 6,512,267 B2 * | 1/2003 | Kinzer et al. | 257/335 |
| 6,576,516 B1 * | 6/2003 | Blanchard | 438/268 |
| 6,608,350 B2 | 8/2003 | Kinzer et al. | |
| 6,627,499 B2 * | 9/2003 | Osawa | 438/259 |
| 6,693,338 B2 | 2/2004 | Saitoh et al. | |
| 6,878,989 B2 | 4/2005 | Izumisawa et al. | |
| 6,919,610 B2 * | 7/2005 | Saitoh et al. | 257/492 |
| 7,126,166 B2 * | 10/2006 | Nair et al. | 257/110 |
| 7,176,524 B2 * | 2/2007 | Loechelt et al. | 257/341 |
| 7,253,031 B2 * | 8/2007 | Takahashi et al. | 438/138 |
| 7,253,477 B2 * | 8/2007 | Loechelt et al. | 257/341 |
| 7,285,823 B2 * | 10/2007 | Loechelt et al. | 257/341 |
| 7,411,266 B2 * | 8/2008 | Tu et al. | 257/492 |
| 7,482,220 B2 * | 1/2009 | Loechelt et al. | 438/227 |
| 2001/0035561 A1 * | 11/2001 | Hirler et al. | 257/510 |
| 2002/0096741 A1 * | 7/2002 | Yamaguchi et al. | 257/557 |
| 2003/0025124 A1 * | 2/2003 | Deboy | 257/119 |
| 2004/0094819 A1 * | 5/2004 | Saitoh et al. | 257/492 |
| 2004/0145013 A1 * | 7/2004 | Pfirsch | 257/335 |
| 2005/0042830 A1 * | 2/2005 | Blanchard | 438/268 |
| 2005/0045922 A1 * | 3/2005 | Ahlers et al. | 257/242 |
| 2005/0186759 A1 * | 8/2005 | So | 438/459 |
| 2006/0024890 A1 * | 2/2006 | Calafut | 438/268 |
| 2006/0065923 A1 * | 3/2006 | Pfirsch | 257/328 |
| 2006/0180857 A1 * | 8/2006 | Loechelt et al. | 257/341 |
| 2006/0180858 A1 * | 8/2006 | Loechelt et al. | 257/341 |
| 2006/0180947 A1 * | 8/2006 | Loechelt et al. | 257/900 |
| 2007/0034947 A1 * | 2/2007 | Loechelt et al. | 257/341 |
| 2007/0207582 A1 * | 9/2007 | Grivna et al. | 438/270 |
| 2007/0222019 A1 * | 9/2007 | Rochefort et al. | 257/493 |
| 2007/0228496 A1 * | 10/2007 | Rochefort et al. | 257/409 |
| 2007/0278565 A1 * | 12/2007 | Tu et al. | 257/330 |
| 2007/0278592 A1 * | 12/2007 | Tu et al. | 257/374 |
| 2008/0081440 A1 * | 4/2008 | Parsey et al. | 438/477 |
| 2008/0258210 A1 * | 10/2008 | Venkatraman et al. | 257/330 |
| 2009/0045440 A1 * | 2/2009 | Grivna et al. | 257/288 |
| 2009/0096021 A1 * | 4/2009 | Loechelt et al. | 257/341 |
| 2009/0108342 A1 * | 4/2009 | Wang et al. | 257/330 |
| 2009/0108343 A1 * | 4/2009 | Nemtsev et al. | 257/330 |

FOREIGN PATENT DOCUMENTS

| | | | |
|---|---|---|---|
| WO | WO2006/025035 | * | 3/2006 |

* cited by examiner

100

110

SEMICONDUCTOR DEVICE HAVING SUB-SURFACE TRENCH CHARGE COMPENSATION REGIONS

FIELD OF THE INVENTION

This invention relates generally to semiconductor devices, and more specifically to power switching devices and methods of their manufacture.

BACKGROUND OF THE INVENTION

Metal-oxide semiconductor field effect transistors (MOSFETS) are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer.

When a MOSFET device is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

Today's high voltage power switch market is driven by two major parameters: breakdown voltage (BVdss) and on-state resistance (Rdson). For a specific application, a minimum breakdown voltage is required, and in practice, designers typically can meet a BVdss specification. However, this is often at the expense of Rdson. This trade-off in performance is a major design challenge for manufacturers and users of high voltage power switching devices.

Recently, superjunction devices have gained in popularity to improve the trade-off between Rdson and BVdss. In a conventional n-channel superjunction device, multiple heavily-doped diffused n-type and p-type regions replace one lightly doped n-type epitaxial region. In the on state, current flows through the heavily doped n-type regions, which lowers Rdson. In the off or blocking state, the heavily doped n-type and p-type regions deplete into or compensate each other to provide a high BVdss. Although superjunction devices look promising, significant challenges still exist in manufacturing them.

Another problem with present high voltage power switch products is that they typically require a large input (e.g., gate or control electrode) charge for switching from one state to another. This requirement places, among other things, an extra burden on peripheral control circuitry.

Accordingly, high voltage power switching device structures and methods of manufacture are needed that provide lower Rdson, high BVdss, and that reduce input charge.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-channel devices, a person of ordinary skill in the art will appreciate that complementary devices are also possible in accordance with the present invention. For clarity of the drawings, doped regions of device structures are illustrated as having generally straight line edges and precise angular corners. However, those skilled in the art understand that due to the diffusion and activation of dopants the edges of doped regions are generally not straight lines and the corners are not precise angles.

In addition, the device of the present invention may embody either a cellular design (where the body regions are a plurality of cellular regions) or a single body design (where the body region is compromised of a single region formed in an elongated pattern, typically in a serpentine pattern). However, the device of the present invention will be described as a cellular design throughout the description for ease of understanding. It should be understood that it is intended that the present invention encompass both a cellular design and a single base design.

DETAILED DESCRIPTION OF A PREFERRED EMBODIMENT

Figure 1:
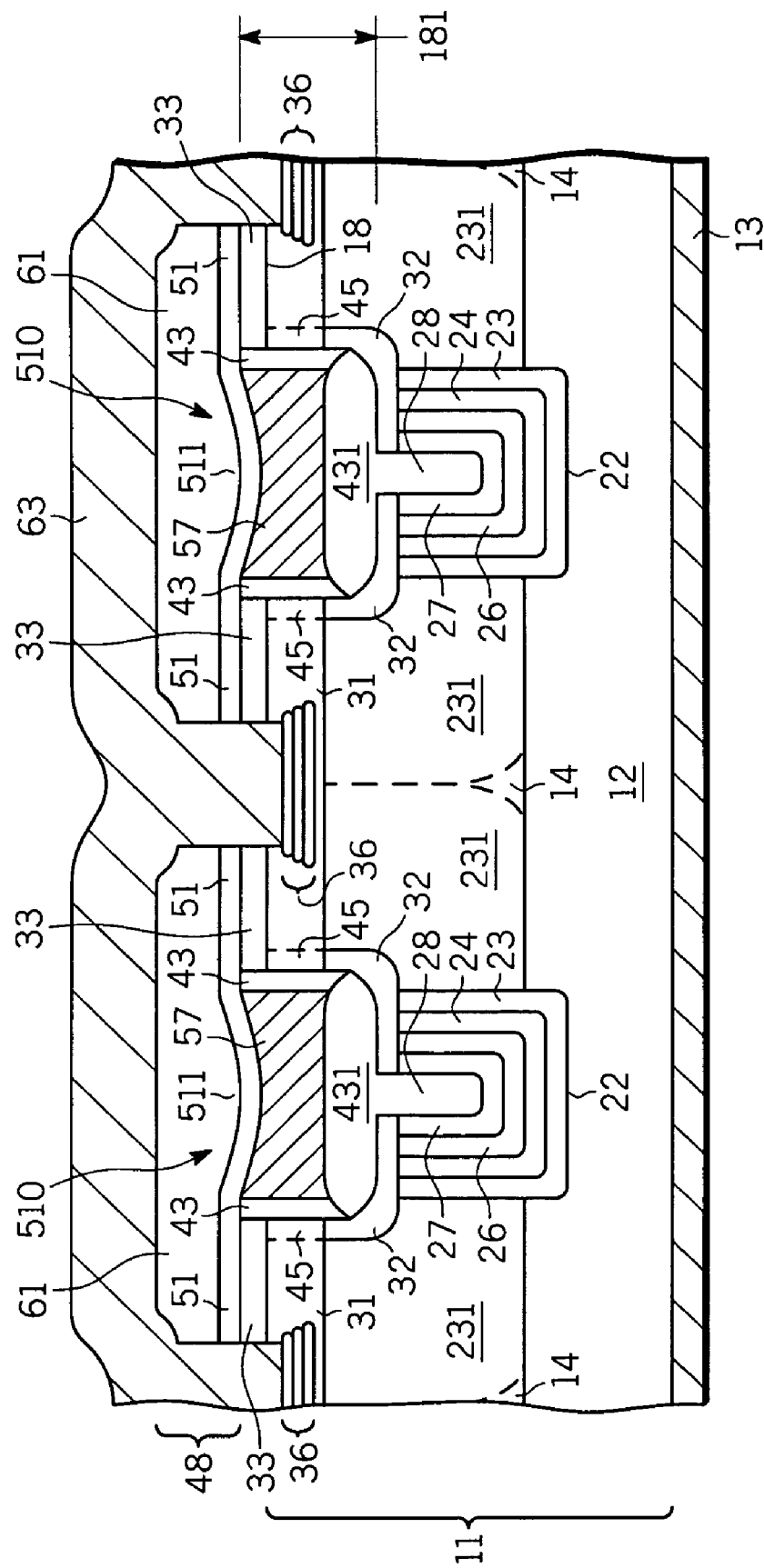
FIG. 1 illustrates an enlarged partial cross-sectional view of a semiconductor device in accordance with the present invention.

FIG. 1 shows a partial cross-sectional view of an insulated gate field effect transistor (IGFET), MOSFET, superjunction device, or switching device or cell 10 in accordance with an embodiment of the present invention. By way of example, device 10 is among many such devices integrated with logic and/or other components into a semiconductor chip as part of a power integrated circuit. Alternatively, device 10 is among many such devices integrated together to form a discrete transistor device.

Device 10 includes a region of semiconductor material 11, which comprises for example, an n-type silicon substrate 12 having a resistivity in range of approximately 0.001 to about 0.005 ohm-cm, and may be doped with arsenic. In the embodiment shown, substrate 12 provides a drain region for device 10, which is coupled to conductive layer 13. A semiconductor layer 14 is formed in or on substrate 12, and in accordance with the present invention is n-type or p-type and doped light enough so as to not impact charge balance in the trench compensation regions described below. In one embodiment, layer 14 is formed using conventional epitaxial growth techniques. In an embodiment suitable for a 600 volt device, layer 14 is doped n-type or p-type with a dopant concentration of about $1.0 \times 10^3$ atoms/cm$^3$ to about $1.0 \times 10^{14}$ atoms/cm$^3$ and has a thickness on the order of about 40 microns to about 60 microns. The thickness of layer 14 is increased or decreased depending on the desired BVdss rating of device 10. In an alternative embodiment, semiconductor layer 14 comprises a graded dopant profile with semiconductor layer 14 having a higher dopant concentration in proximity to substrate 12, and transitioning either gradually or abruptly to a lower concentration for the balance of its thickness. Other materials may be used for body of semiconductor material 11 or portions thereof including silicon-germanium, silicon-germanium-carbon, carbon doped silicon, III-V materials, or the like.

In accordance with the present invention, device 10 further includes a filled trench structure or structures 510 formed in region of semiconductor material 11. Filled trench structure 510 comprises a superjunction portion, sub-surface charge compensation portion, or compensation portion 22, and a control portion or gate control portion 511 overlying compensation portion 22. Compensation portions 22 comprise spaced apart and sub-surface filled trenches, semiconductor material filled trenches, epitaxial filled regions or trenches, charge compensating trench regions, deep trench charge compensation regions, charge compensating filled trenches, charge compensating portion or charge compensation regions 22. Portions 22 include a plurality of layers or multiple layers of semiconductor material, including layers of opposite conductivity type, which are preferably separated by an intrinsic or buffer semiconductor layer or layers. The intrinsic layer functions, among other things, to prevent or reduce intermixing of the opposite conductivity type layer (i.e., the two charge layers), which is believed to negatively impact the conduction efficiency of device 10 in the on state. As used herein, charge compensation generally means that the total charge of the opposite conductivity type layers is substantially balanced or equal.

In one embodiment, compensation portions 22 include multiple layers or stacked layers of semiconductor material formed using single crystal (i.e., not polycrystalline) epitaxial growth techniques, and these layers terminate or end below major surface 18 a distance 181. For example, compensation portions 22 include a p-type layer 23 formed on, over, or adjoining the trench walls or surfaces adjacent to body of semiconductor material 11. An intrinsic semiconductor or buffer layer 24 is formed on, over, or adjoining p-type layer 23, an n-type layer 26 is formed on, over, or adjoining intrinsic semiconductor layer 24, and an intrinsic semiconductor or buffer layer 27 is formed on, over, or adjoining n-type layer 26. Intrinsic layer 24 functions, among other things, to prevent or reduce the mixing of dopants from layers 23 and 26, which, as stated previously, improves the conduction efficiency of device 10. Intrinsic layer 27 functions, among other things, to fill or partially fill the trench. For an n-channel device and in accordance with the present invention, n-type layers 26 provide a primary vertical low resistance current path from the channel to the drain when device 10 is in an on state. When device 10 is an off state, p-type layers 23 and n-type layers 26 compensate each other in accordance with the present invention to provide an increased BVdss characteristic. It is understood that additional n-type and p-type layers may be used, and preferably separated by additional intrinsic or buffer layers. In an alternative embodiment and as shown in FIG. 1, a dielectric layer 28 is formed overlying the outermost (e.g., layer 26 or 27). In one embodiment, dielectric layer 28 fills any remaining space within compensation portion 22. In another embodiment dielectric layer 28 only partially fills any remaining space within portion 22 leaving, for example an air gap. By way of example, dielectric layer 28 comprises an oxide, a nitride or combinations thereof. In another embodiment, dielectric layer 28 comprises a thin thermal oxide capped with a thin polysilicon layer followed by a deposited TEOS layer. It was observed that in some applications, the thin oxide capped with polysilicon reduces shear stress from the deposited oxide thereby improving device performance. It is further understood that during thermal processing, n-type and p-type dopants from layers 26 and 23 diffuse into the buffer layers, and that distinct buffer layers may or may not be present in the final device. However, when deposited or formed, buffer layers 24 and/or 27 have a lower dopant concentration than layers 23 and 26.

By way of example, p-type layers 23 and n-type layers 26 each have a dopant concentration on the order of about $9.0 \times 10^{16}$ to about $3.0 \times 10^{16}$ atoms/cm$^3$, and each have a thickness of about 0.1 microns to about 0.3 microns respectively. In one embodiment, intrinsic semiconductor or buffer layers 24 and 27 are undoped or very lightly doped p-type with a dopant concentration of less than about $1.0 \times 10^{14}$ atoms/cm$^3$, and each has a thickness of about 0.5 microns to about 1.0 microns. The thickness of layer 27 is adjusted, for example, to fill the balance of the trench between the deposited layers if dielectric layer 28 is not used.

In accordance with the present invention, dopant from p-type layer 23 is diffused into semiconductor layer 14 to form p-type regions or laterally doped or diffused regions 231 (represented as dashed lines) underneath body regions 31 described below. P-type regions 231 laterally diffusing from adjacent compensation portions 22 may either completely merge together, or may not completely merge as shown in FIG. 1 so that a portion of semiconductor 14 is still present in the finished device. That is, the actual diffusion distance between adjacent laterally diffused region 231 is variable.

In accordance with the present invention, in one embodiment, diffused regions 231 comprise the opposite conductivity type to that of semiconductor layer 14. This embodiment provides for a unique structure where both the active device structure and edge termination structures (not shown) are formed in the same layer (i.e., layer 14), but the active device (i.e., device 10) is in a p-type layer because of laterally diffused regions 231, and the edge termination structures are formed in n-type layer 14 laterally separated from compensation portions 22.

Although not shown, it is understood that during the formation of device 10, n-type dopant from highly doped substrate 12 diffuses into the lower portions of compensation regions 22 so that those portions of compensation regions 22 that are within substrate 12 become more heavily doped n-type.

Trench gate structures or control portions 511 include a control or gate electrode or conductive layer or region 57, separated on vertical sidewalls of the trench regions by a gate dielectric layer, region or material 43. In one embodiment, gate dielectric layer 43 comprises a silicon oxide, and has a thickness of about 0.05 microns to about 0.1 microns. In alternative embodiments, gate dielectric layer 43 comprises silicon nitride, tantalum pentoxide, titanium dioxide, barium strontium titanate, or combinations thereof including combinations with silicon oxide, or the like. Conductive gate regions 57 comprise, for example, n-type polysilicon, and are about 0.3 microns to about 0.5 microns in thickness.

In accordance with one embodiment of the present invention, an optional thick dielectric layer 431 separates, isolates, or insulates gate conductive regions 57 from sub-surface trench compensation regions 22. In this embodiment, dielectric layer 431 is thicker than dielectric layers 43. By way of example, dielectric layer 431 comprises about 0.1 microns to about 0.2 microns of thermal oxide. In an alternative embodiment, gate dielectric layer 43 is used to isolate gate conductive regions 57 from sub-surface trench compensation regions 22.

A body or doped region 31 is formed in semiconductor layer 14 between and in proximity to or adjacent to, or adjoining trench gate structures 510, and extends from major surface 18 of body of semiconductor material 11. In one embodiment, body regions 31 comprise p-type conductivity, and have a dopant concentration suitable for forming an inversion layer that operates as conduction channels 45 of device 10 when gate structures 510 are appropriately biased as described below. Body regions 31 extend from major surface 18 to a depth of about 1.0 to about 5.0 microns. N-type source regions 33 are formed within or in body region 31 in proximity to or adjacent to, or adjoining trench gate structures 510. In one embodiment, source regions 33 extends from major surface 18 to a depth of about 0.2 microns to about 0.5 microns. One or more p-type body contact regions 36 are formed in body region 31 partially within and/or below source regions 33. Body contact regions 36 are configured to provide a lower contact resistance to body region 31, and to lower the sheet resistance of body regions 31 under source regions 33, which suppresses parasitic bipolar effects.

In accordance with the present invention, device 10 further includes n-type channel connect, or drain extension regions 32, which are configured to electrically couple channel regions 45 to subsurface trench compensation regions 22. In one embodiment and as shown in FIG. 1, channel connect regions 32 are formed below and adjoining body regions 31. Channel connect regions 32 further adjoin upper surfaces of or portions of layers 23 and 26 to provide a conduction path between source regions 33 and layer 26 when device 10 is in operation.

An interlayer dielectric region 48 is formed over lying major surface 18, and comprises for example, a first dielectric layer 51 formed overlying conductive gate regions 57, and a second dielectric layer 61 formed overlying first dielectric layer 51. By way of example, dielectric layer 51 comprises a silicon oxide, and has thickness from about 0.02 microns to about 0.05 microns. Dielectric layer 61 comprises for example, a deposited oxide, and has a thickness of about 0.4 microns to about 1.0 microns.

Openings are formed in interlayer dielectric region 48 to provide contacts to device 10 for source contact layer 63. As shown, a portion of major surface 18 is etched so that source contact layer 63 makes contact to both source regions 33 and body regions 36. In one embodiment, source contact layer 63 comprises a titanium/titanium nitride barrier layer and an aluminum silicon alloy formed overlying the barrier layer, or the like. Drain contact layer 13 is formed on an opposing surface of region of semiconductor material 11, and comprises, for example, a solderable metal structure such as titanium-nickel-silver, chrome-nickel-gold, or the like.

The operation of device 10 proceeds as follows. Assume that source terminal 63 is operating at a potential $V_S$ of zero volts, gate regions 57 receive a control voltage $V_G$=5.0 volts, which is greater than the conduction threshold of device 10, and drain terminal 13 operates at drain potential $V_D$=5.0 volts. The values of $V_G$ and $V_S$ cause body region 31 to invert under gate regions 57 to form channels 45, which electrically connect source regions 33 to channel connect regions 32. A device current $I_D$ flows from drain terminal 13 and is routed through n-type layers 26, channel connect regions 32, channels 45, source regions 33, to source terminal 63. Hence, current $I_D$ flows vertically through n-type layers 26 to produce a low on resistance. In one embodiment, $I_D$=1.0 amperes. To switch device 10 to the off state, a control voltage $V_G$ of less than the conduction threshold of device is applied to gate regions 57 (e.g., $V_G$<5.0 volts). This removes channels 45, $I_D$ no longer flows through device 10. In the off state, n-type layers 26 and p-type layers 23 compensate each other as the depletion region from the primary blocking junction spreads, which enhances BVdss.

Figure 2:
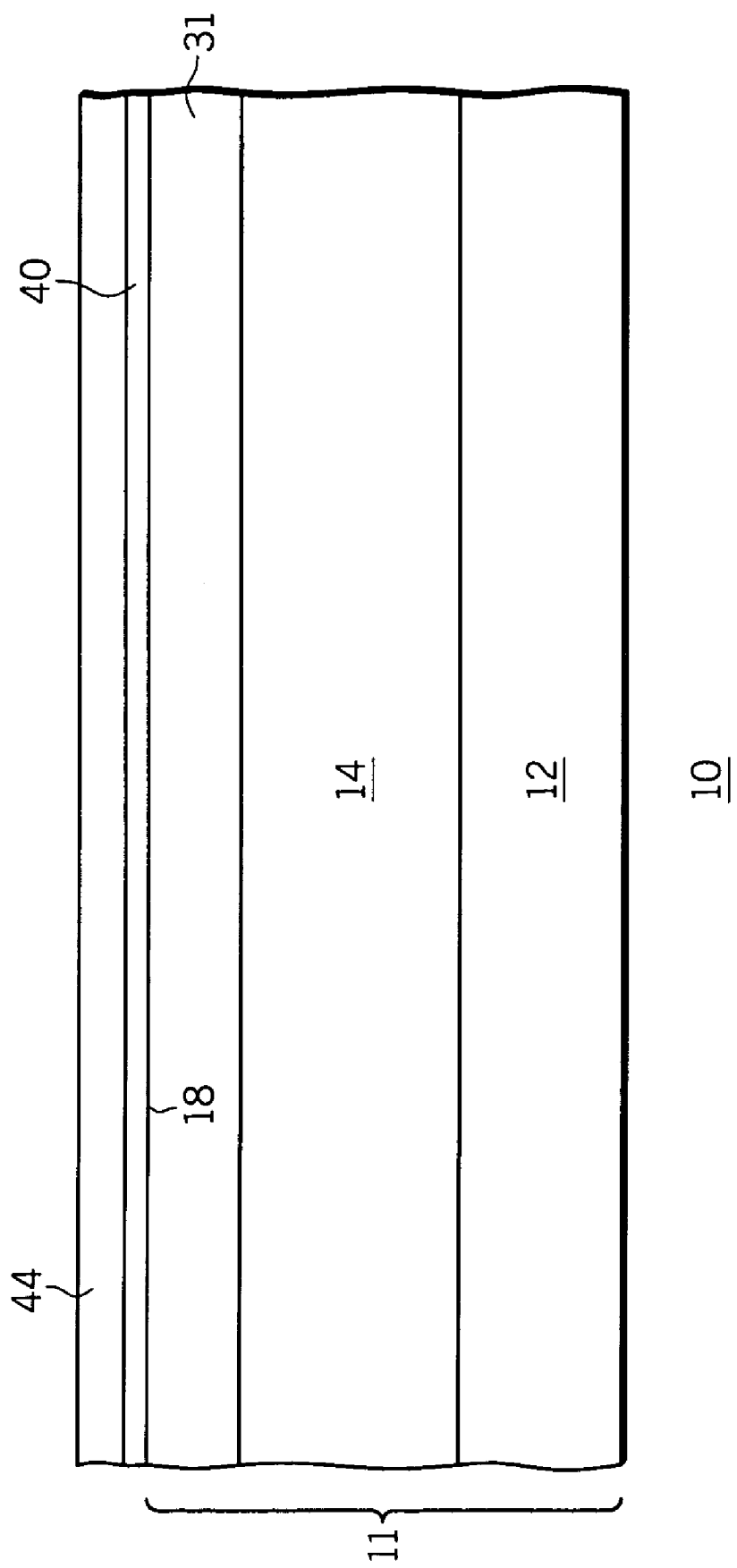
FIGS. 2-11 illustrate enlarged partial cross-sectional views of the semiconductor device of FIG. 1 at various stages of fabrication.

Turning now to FIGS. 2-9, a process for forming device 10 in accordance with the present invention is described. FIG. 2 shows an enlarged partial cross-sectional view of device 10 at an early stage of fabrication. An example of the material characteristics of body of semiconductor material 11 was provided in conjunction with FIG. 1 above. In an early step, a first dielectric layer 40 is formed over major surface 18, and comprises for example, a silicon oxide about 0.05 microns to about 0.1 microns thick. A standard photolithography step is then used to provide openings for p-type body regions 31 and edge termination structures (not shown). P-type body regions 31 are selectively formed in semiconductor layer 14 through dielectric layer 40. In an embodiment suitable for a 600 volt device, boron is implanted at a dose of about $1.0 \times 10^{13}$ atoms/cm$^2$ and an implant energy of about 160 KeV to form regions 31. A second dielectric layer 44 comprising for example a different material than first dielectric layer 40 is then formed overlying first dielectric layer 40. By way of example, second dielectric layer 44 comprises a silicon nitride when first dielectric layer 40 comprises a silicon oxide. In one embodiment, second dielectric layer 44 comprises approximately 0.2 microns of silicon nitride, and is formed using conventional deposition techniques. Next, the implanted p-type dopant is heat treated to diffuse the dopant to a desired depth to form regions 31. By way of example, body regions 31 have a depth of about 3.0 to about 5.0 microns.

Figure 3:
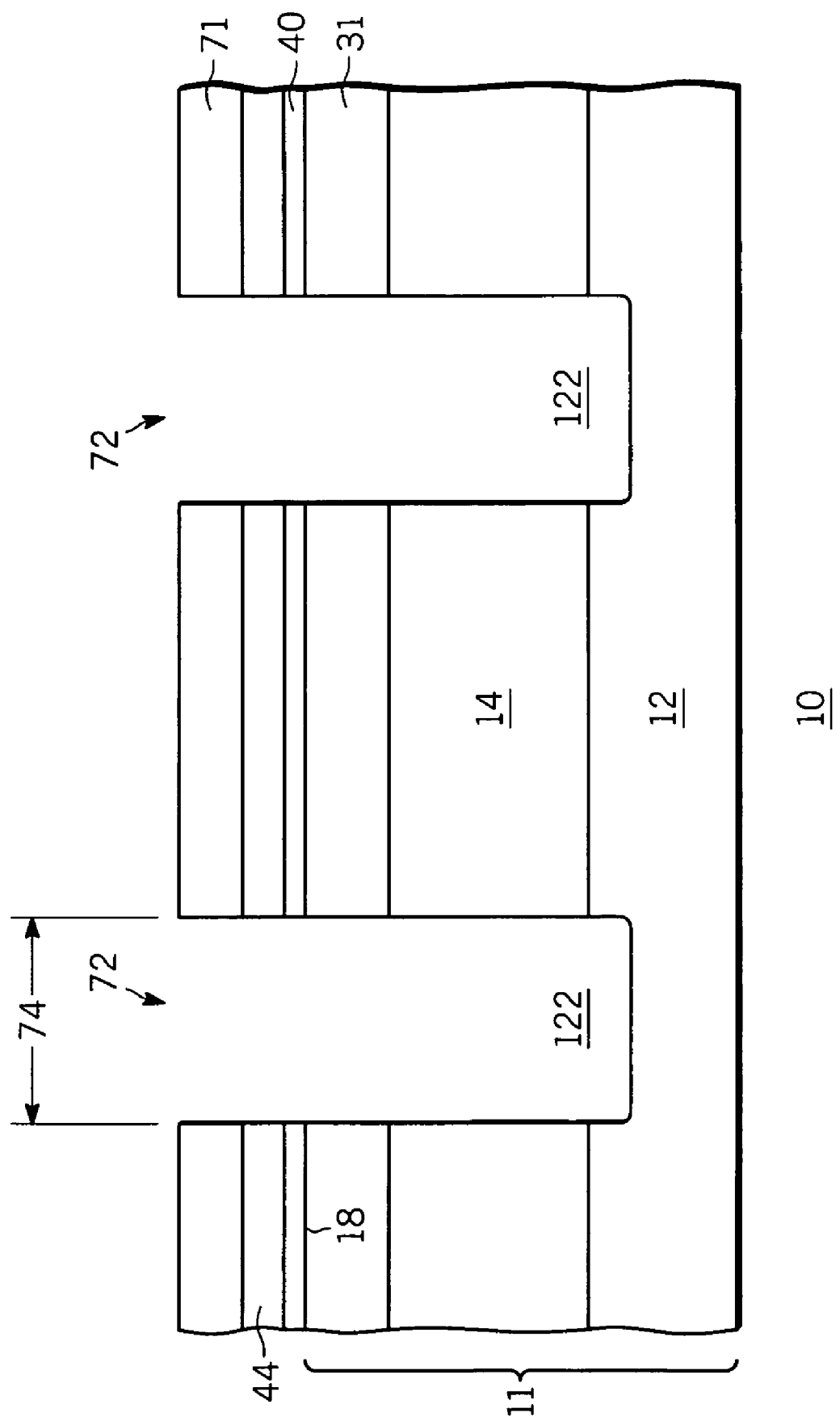

FIG. 3 shows an enlarged partial cross-sectional view of device 10 at a subsequent stage of fabrication. Hard mask layer 71 is formed overlying major surface 18 and patterned to form openings 72 through hard mask layer 71, second dielectric layer 44, and first dielectric layer 40 to expose portions of major surface 18. By way of example, hard mask layer 71 comprises about 1.0 microns of deposited oxide. By way of example, openings 72 have a width 74 on the order of about 3.0 microns to about 5.0 microns. Next, trenches 122 are formed through semiconductor layer 14. In one embodiment, trenches 122 extend into at least a portion of substrate 12. The depth of trenches 122 is determined by the thickness of semiconductor layer 14, which is a function of BVdss. In one embodiment, Deep Reactive Ion Etching (DRIE) etching with a fluorine or chlorine based chemistry is used to form trenches 122. Several techniques are available for DRIE etching including cryogenic, high density plasma, or Bosch DRIE processing. In one embodiment, trenches 122 have substantially vertical sidewalls. In an alternative embodiment, trenches 122 have a tapered profile where the width of the trench at the trench lower surface is less than width 74. Although trenches 122 are stated as plural, it is understood that trenches 122 may be a single continuous trench or connected trench matrix. Alternatively, trenches 122 may be a plurality of individual trenches with closed ends and separated by portions of body of semiconductor material 11.

Figure 4:
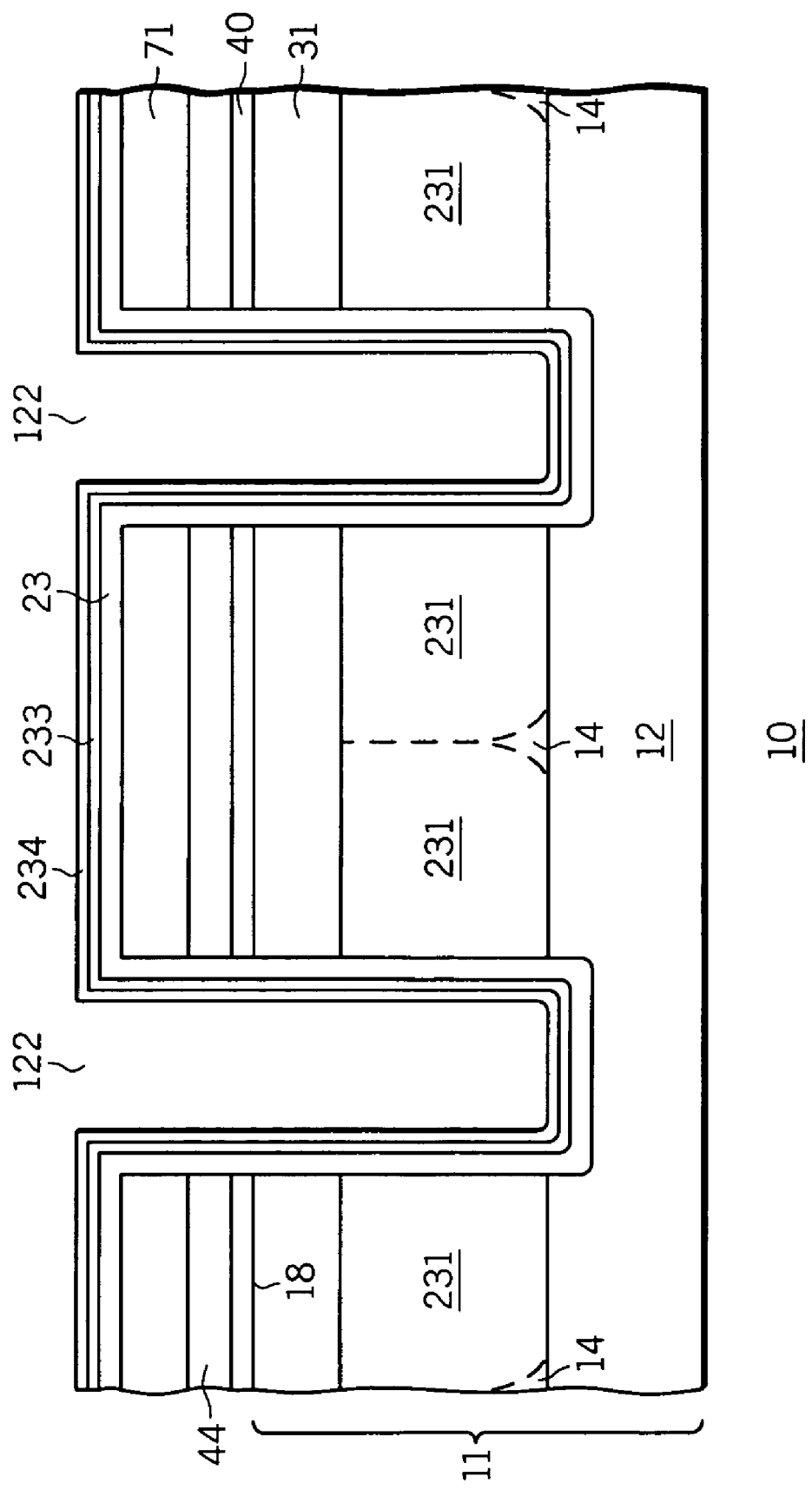

FIG. 4 shows an enlarged partial cross-sectional view of device 10 at a further stage of processing. At this point, layers of semiconductor material are formed, grown, or deposited in trenches 122 as a first stage in forming filled trenches or sub-surface charge compensation regions 22. In one embodiment, single crystal semiconductor epitaxial growth techniques are used to fill trenches 122. That is, single crystal semiconductor layers are grown within trenches 122.

In a first step, a thin thermal oxide (not shown) is formed on the sidewalls of trenches 122 to remove any surface damage caused by the DRIE step. The thin thermal oxide is then removed using conventional isotropic etching techniques (e.g., 10:1 wet oxide strip). Next, body of semiconductor material 11 is placed into an epitaxial growth reactor and pre-cleaned as a first step of the epitaxial growth process. When silicon is the selected semiconductor material for the fill layers (e.g., layers 23, 24, 26, and 27), silicon source gases such as $SiHCl_3$, $SiH_2Cl_2$, $SiH_4$ or $Si_2H_6$ are suitable for forming these layers. In the embodiment shown, blanket layers are grown (i.e., the layers are grown over major surface 18 in addition to trenches 122). In an alternative embodiment, selective epitaxial growth techniques are used to form layers 23, 24, 26, and 27 so that these layers are not formed overlying major surface 18, but only within trenches 122.

P-type layer 23 is grown first along the surfaces of trenches 122, with boron being a suitable dopant source. By way of example, p-type layer 23 has a dopant concentration on the order of about $3.0 \times 10^{16}$ to about $9.0 \times 10^{16}$ atoms/cm$^3$, and a thickness of about 0.1 microns to about 0.3 microns. In an optional embodiment and as shown in FIG. 4, an intrinsic layer 233 is formed overlying p-type layer 23, and has a thickness of about 0.1 to about 0.2 microns. A capping layer 234 is then formed overlying layer 233, and comprises for example, about 0.05 microns of thermal oxide and about 0.1 microns of nitride. Next, device 10 is heated primarily to laterally diffuse p-type dopant from layer 23 into semiconductor layer 14 to form laterally diffused p-type regions 231. Layer 234 is configured to cap p-type layer 23 during the heat treatment step to prevent dopant from out-diffusing from layer 23. Also, during the heat treatment step, n-type dopant from substrate 12 diffuses into portions 1200 of layer 23 converting portions 1200 to n-type. Further, p-type dopant in layer 23 diffuses into intrinsic layer 233 converting intrinsic layer 233 into p-type layer 23, which is shown as a continuous layer 23 in FIGS. 5-12. After the heat treatment step, capping layer 234 is removed.

Figure 5:
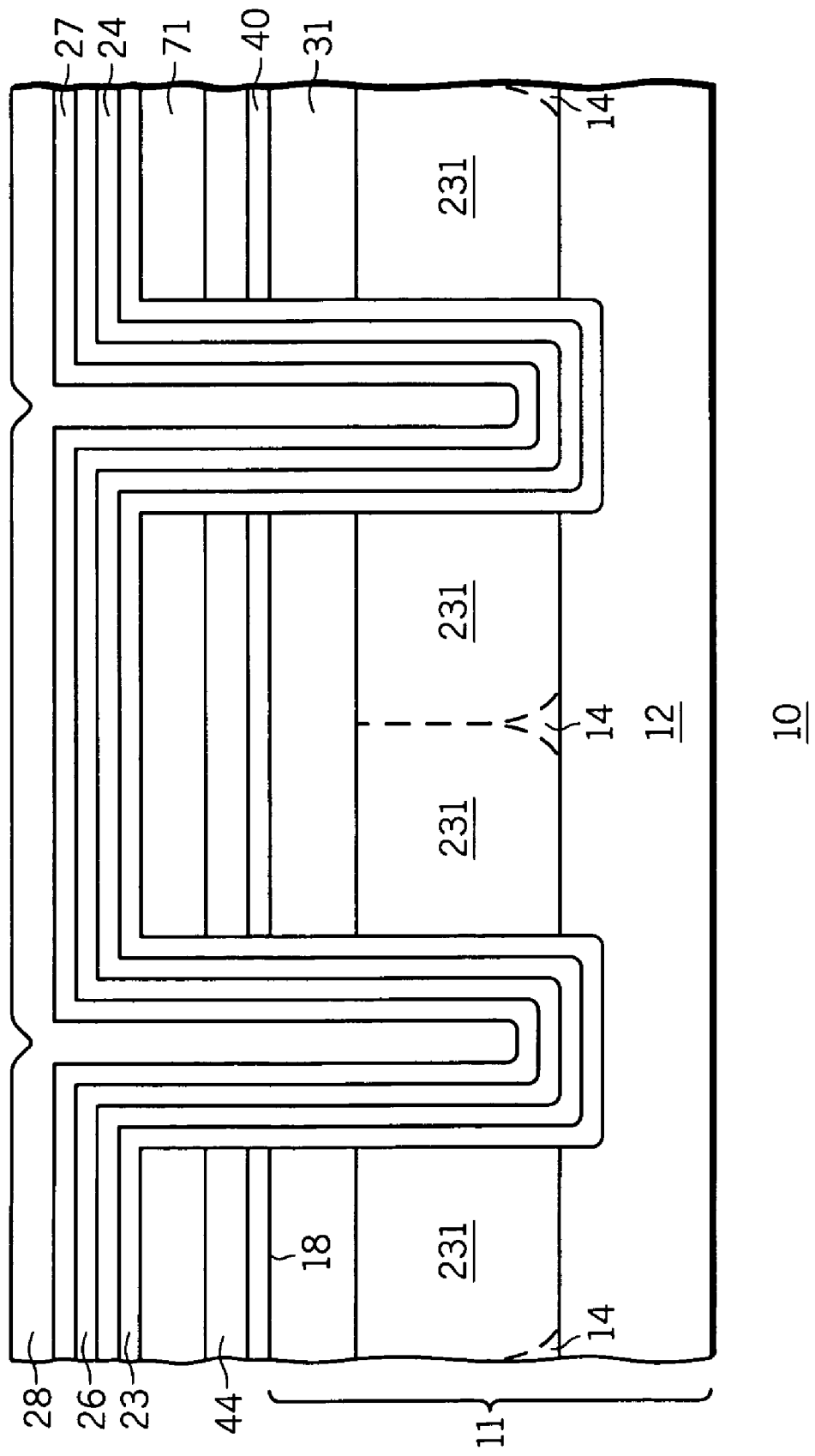

Turning now to FIG. 5, intrinsic or buffer layer 24 is grown overlying p-type layer 23, and is either undoped, or is very lightly doped p-type with a dopant concentration of less than about $2.0 \times 10^{14}$ atoms/cm$^3$. Layer 24 has a thickness of about 0.5 microns to about 1.5 microns. N-type layer 26 is then grown overlying layer 24, with a phosphorous, arsenic or antimony dopant source being suitable. In one embodiment, n-type layer 26 has a dopant concentration on the order of about $3.0 \times 10^{16}$ to about $9.0 \times 10^{16}$ atoms/cm$^3$, and a thickness of about 0.1 microns to about 0.3 microns. Intrinsic or buffer layer 27 is then grown over n-type layer 26, and is either undoped (except for those trace impurities typically present in the silicon source material and/or residual dopant gases remaining in the reactor chamber after the previous growth step), or is very lightly doped n-type with a dopant concentration of less than about $2.0 \times 10^{14}$ atoms/cm$^3$. Layer 27 has a thickness of about 0.1 microns to about 0.3 microns. Next a thin wet oxide is grown over layer 27 followed by the formation of dielectric layer 28, which comprises for example a deposited oxide having a thickness suitable to fill trenches 122. In one embodiment, multiple steps are used to form dielectric layer 28, with etch-back or planarization steps done in between deposition steps to ensure that trenches 122 are filled to a desired level. It should be understood that the thicknesses of layers 23, 24, 26, 27, and 28 are adjusted depending on the width of trenches 122.

Figure 6:
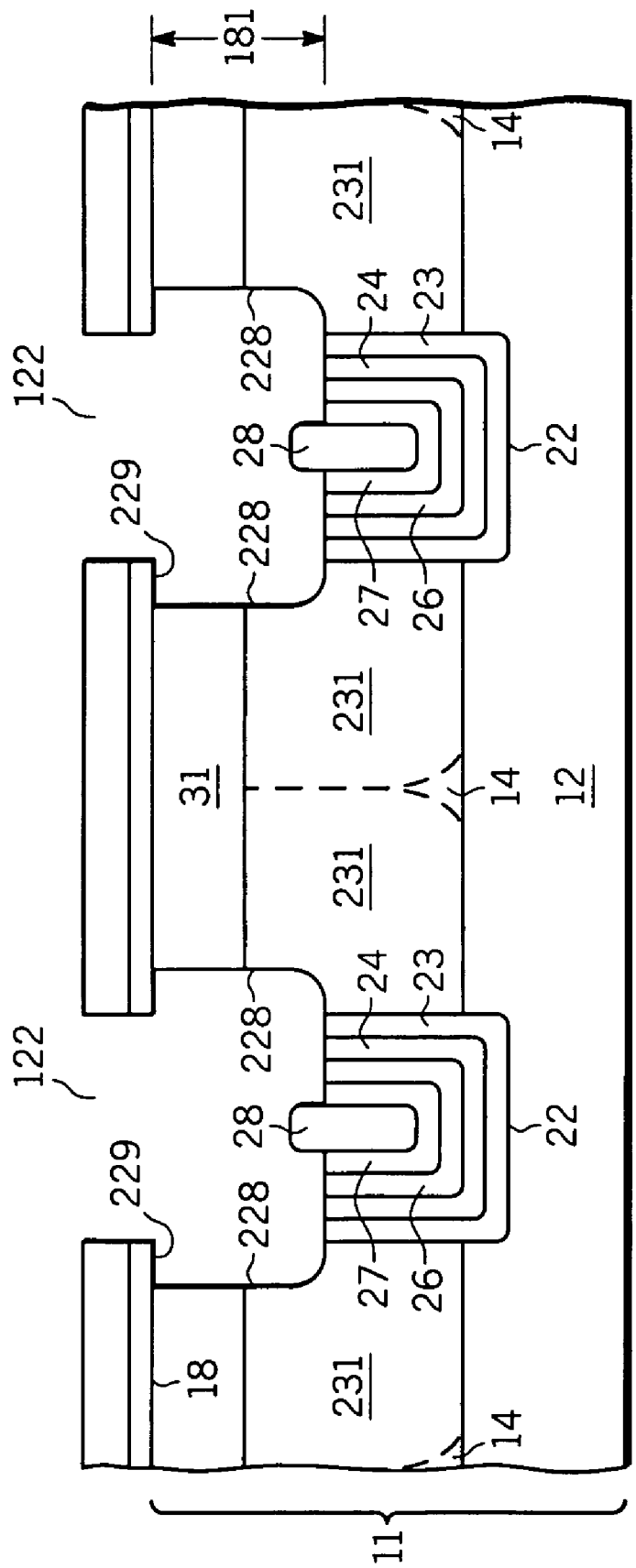

FIG. 6 shows an enlarged partial cross-sectional view of device 10 at a still further stage of fabrication after layers 28, 27, 26, 24, 23, are planarized and recessed below major surface 18 to form subsurface filled trench compensation regions or compensation portions 22. In one embodiment, layers 28, 27, 26, 24, and 23 are recessed a distance 181, which is greater than the depth of body regions 131. By way of example, etch back is used to planarize and recess these layers. By way of example, a dry etch techniques with fluorine or chlorine based chemistries are used to etch the layers. In one embodiment, a polysilicon layer and a photoresist layer are first formed overlying dielectric layer 28, and the layers are then etched back or planarized using second dielectric layer 44 as a stop layer to protect portions of major surface 18. In one embodiment and as shown in FIG. 6 portions of sidewalls 228 are etched to be laterally recessed underneath portions 229 of dielectric layer 40 so that upper portions of trenches 122 are wider than the lower portions containing layers 23, 24, 26, 27 and 28, which among other things provides enhanced alignment of channel connecting regions 32 described below.

Figure 7:
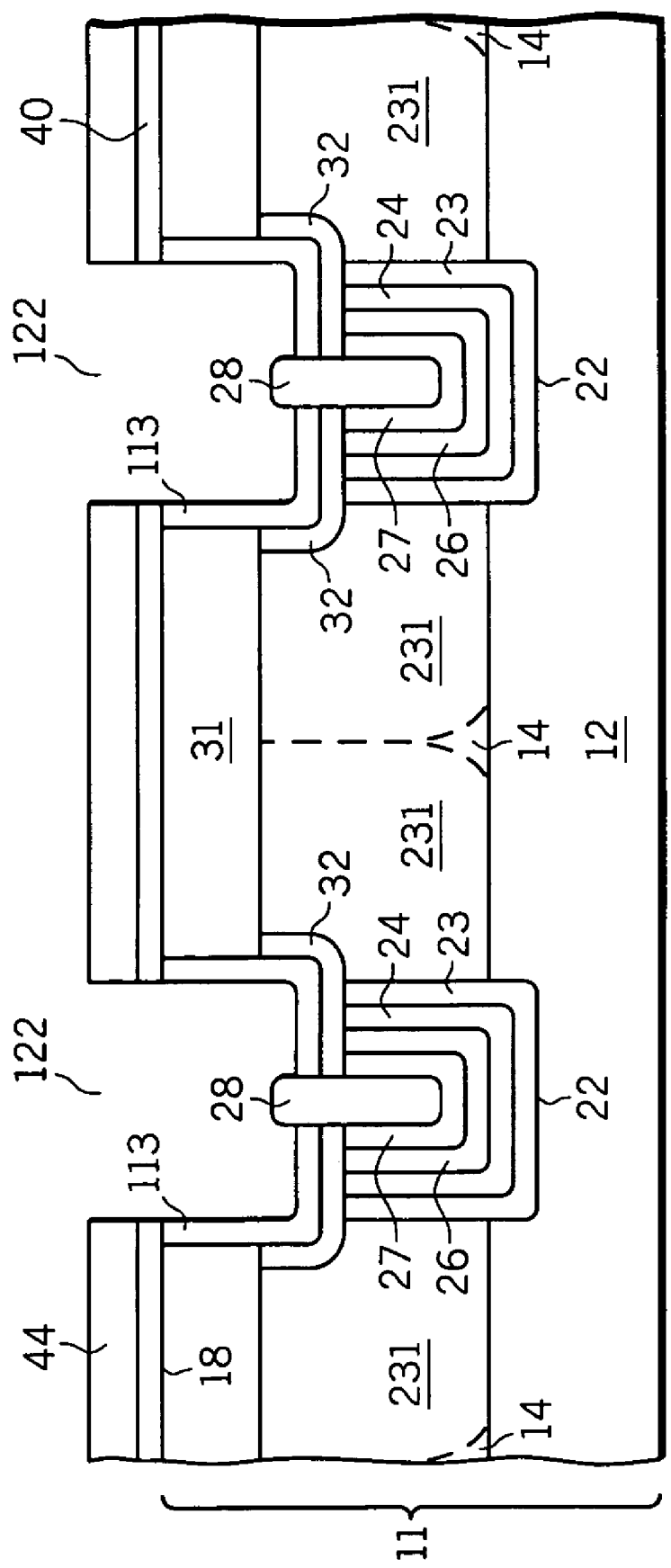

FIG. 7 shows an enlarged partial cross-sectional view of device 10 after additional processing. A dielectric layer 113 is formed on exposed surfaces of trenches 122 including upper surfaces of layers 23, 24, 26 and 27. By way of example the dielectric layer comprises about 0.1 microns of thermal oxide. Next, channel connecting regions 32 are formed adjoining layers 23 and 24 as well as body regions 32. By way of example, channel connecting regions 32 are formed using ion implantation with an n-type dopant such as phosphorous. An implant dose of about $1.0 \times 10^{13}$ atoms/cm$^2$ to about $1.0 \times 10^{14}$ atoms/cm$^2$ and an implant energy of about 120 KeV to about 150 KeV is suitable for one embodiment of the present invention. In one embodiment angled implantation is used to provide lateral penetration of dopant below body regions 31. After the implant step, the dielectric layer 113 is removed using conventional techniques.

Figure 8:
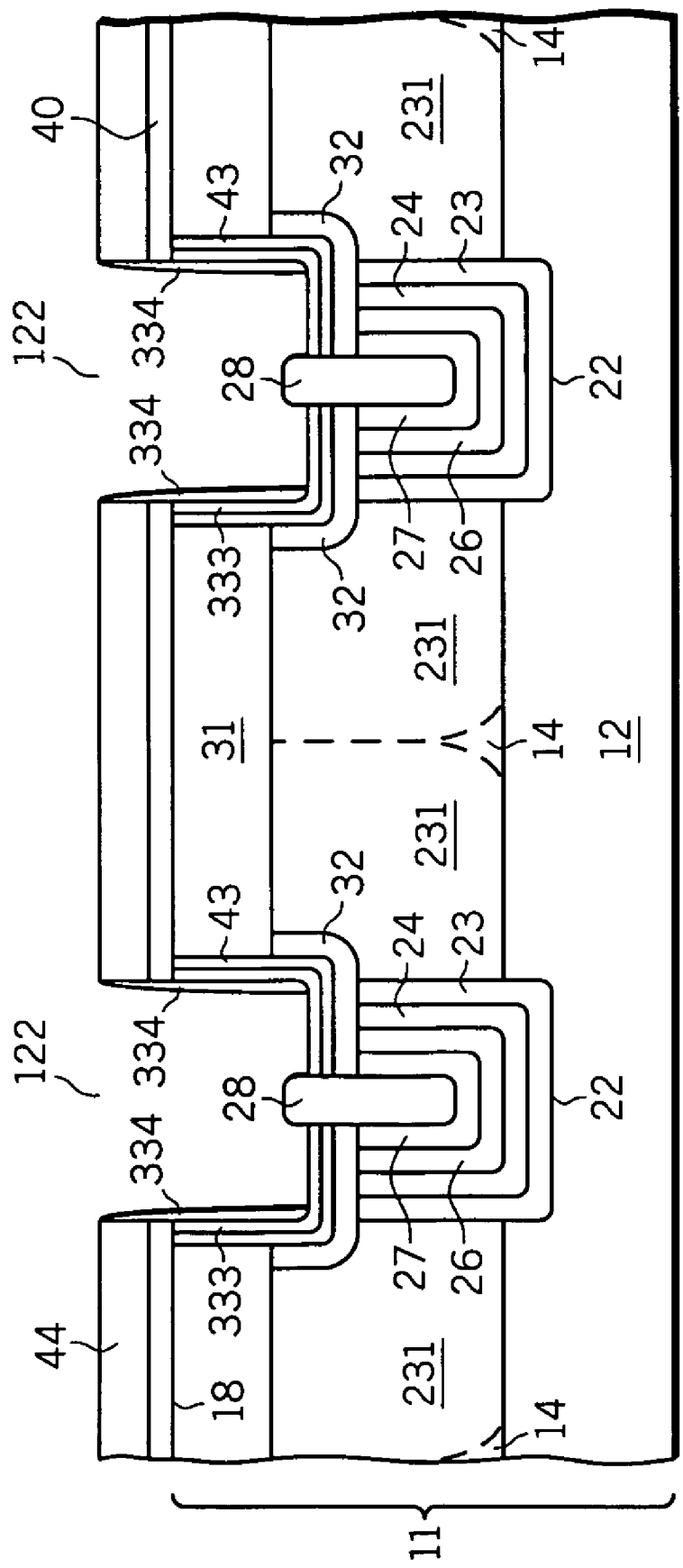

FIG. 8 shows an enlarged partial cross-sectional view of device 10 after further processing. Gate dielectric layer 43 is formed overlying exposed surfaces of trenches 122 and connecting regions 32. In one embodiment, gate dielectric layer 43 comprises silicon oxide, and has a thickness of about 0.05 microns to about 0.1 microns. When optional thick dielectric layer 431 is used, the following description illustrates one method of its formation together with FIG. 8. After gate dielectric layer 43 is formed, a polysilicon layer about 0.05 microns thick is formed overlying gate dielectric layer 43. The polysilicon layer is then etched to form poly spacers 333 within an along upper sidewalls of trenches 122 and preferably recessed under dielectric layer 44. A dielectric layer is then formed overlying gate dielectric layer 43 and spacers 333. By way of example the dielectric layer comprises about 0.05 microns of silicon nitride, which is then etch to form nitride spacers 334 adjoining poly spacers 333 and dielectric layers 40 and 44. Next, dielectric layer 431 (shown in FIG. 9) is grown above channel connecting regions 32 between spacers 334. By way of example, dielectric layer 431 comprise about 0.1 to about 0.2 microns of thermal oxide. Nitride spacers 334 and poly spacers 333 are then removed.

Figure 9:
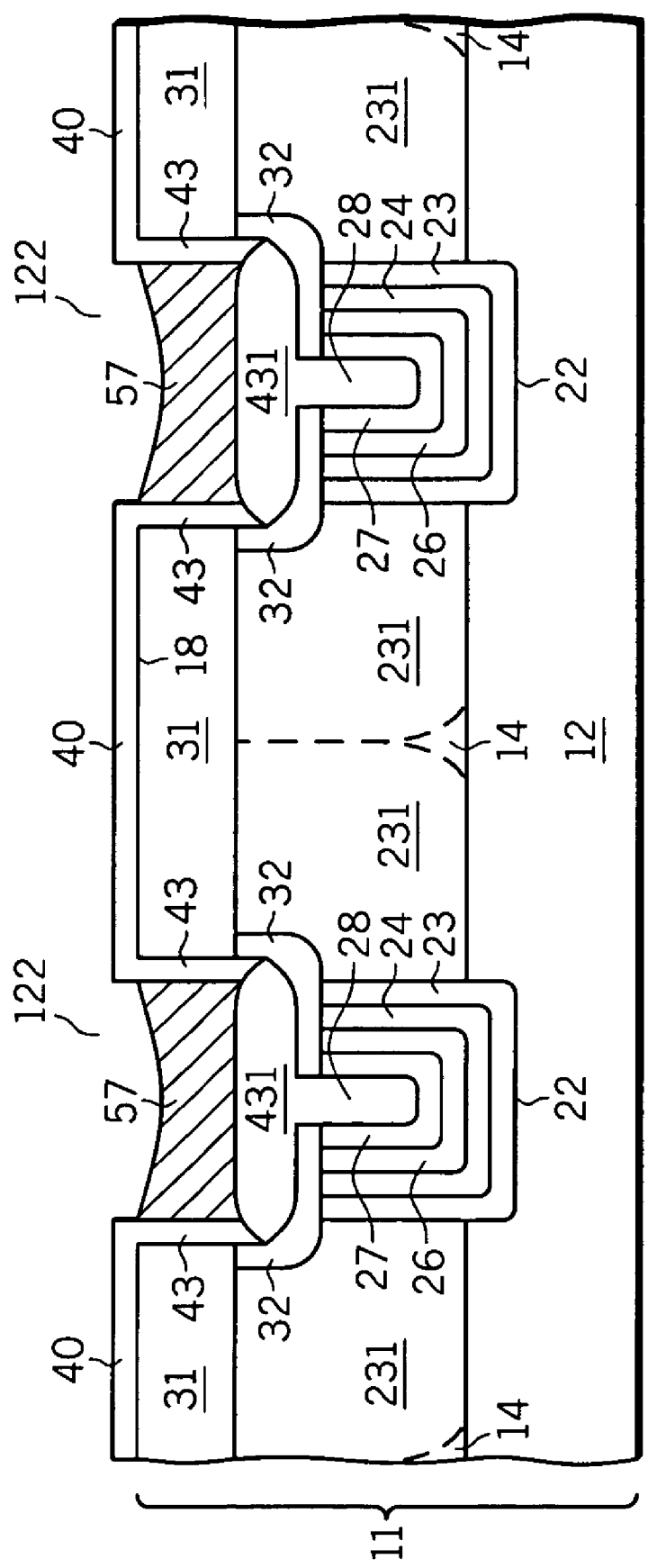

FIG. 9 shows an enlarged partial cross-sectional view of device 10 after still further processing. A conductive layer such as a doped polysilicon layer is deposited overlying gate dielectric layer 43 and patterned to form gate conductive regions 57 within trenches 122 above sub-surface trench compensation regions 22. For example, gate conductive regions 57 comprise about 0.3 microns to about 0.5 microns of phosphorous doped polysilicon. In one embodiment, gate 57 are annealed prior to etch. Gate conductive regions 57 and gate dielectric region 43 form control portion 511 of filled trench structure 510. In one embodiment, dielectric layer 40 is removed at this point using conventional techniques.

Figure 10:
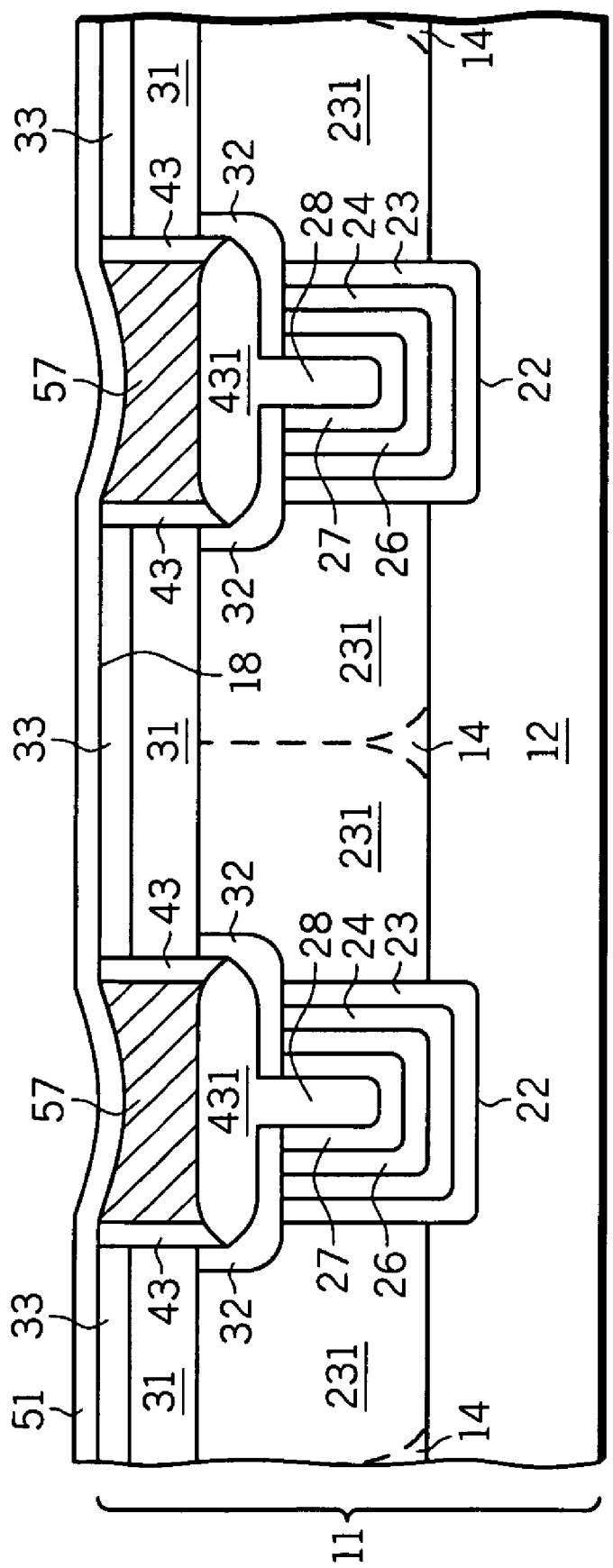

FIG. 10 shows an enlarged partial cross-sectional view of device 10 at another stage of fabrication. A dielectric layer 51 is deposited overlying major surface 18. By way of example, layer 51 comprises a thin oxide layer having a thickness on the order of about 0.02 microns to about 0.07 microns. Next a conventional photolithographic step is used to provide openings for source regions 33. By way of example, a phosphorous implant dose of $3.0 \times 10^{15}$ atoms/cm$^2$ with an implant energy of 80 KeV is used for forming source regions 33. Any masking materials such as photoresist used to form source regions 33 are then removed.

Figure 11:
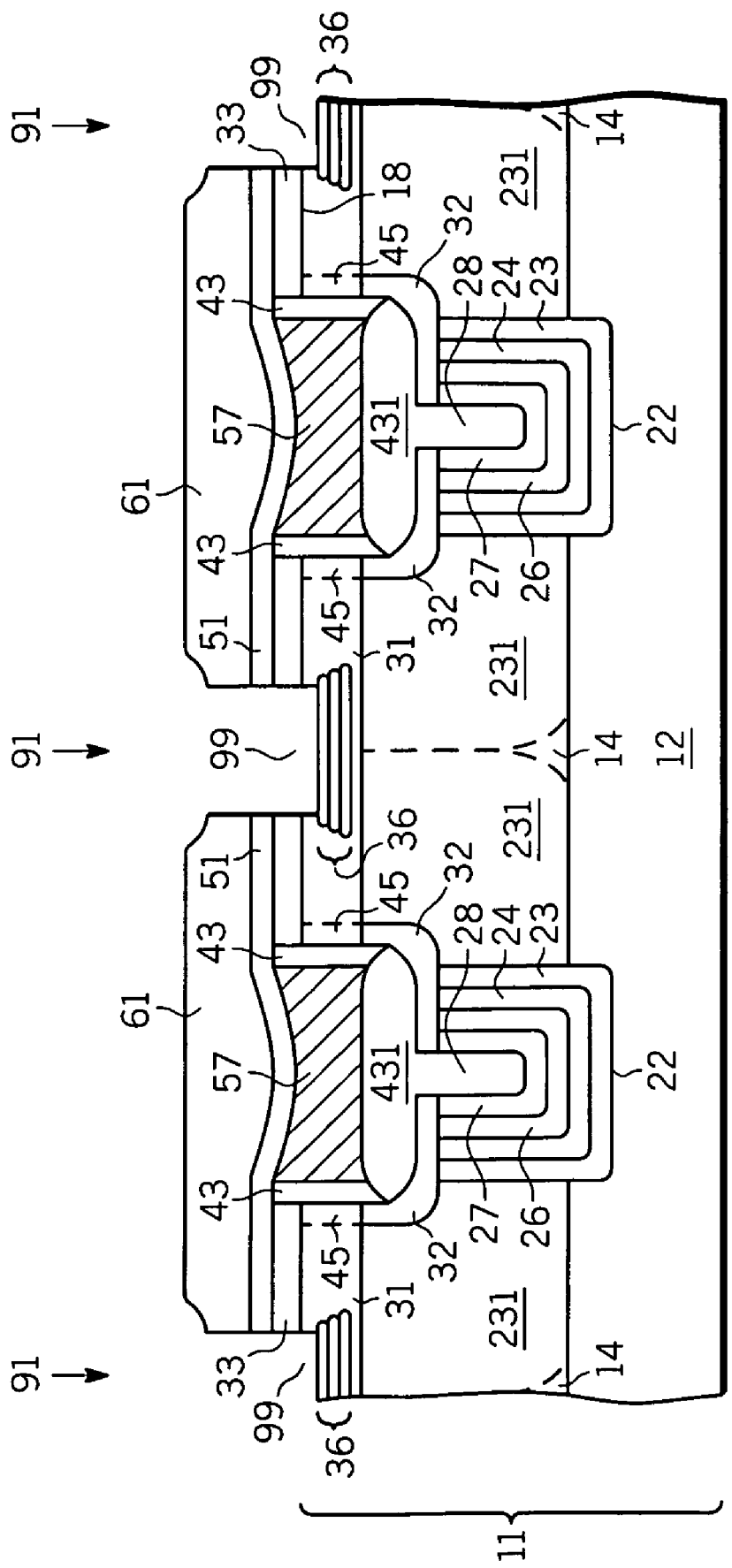
Figure 12:
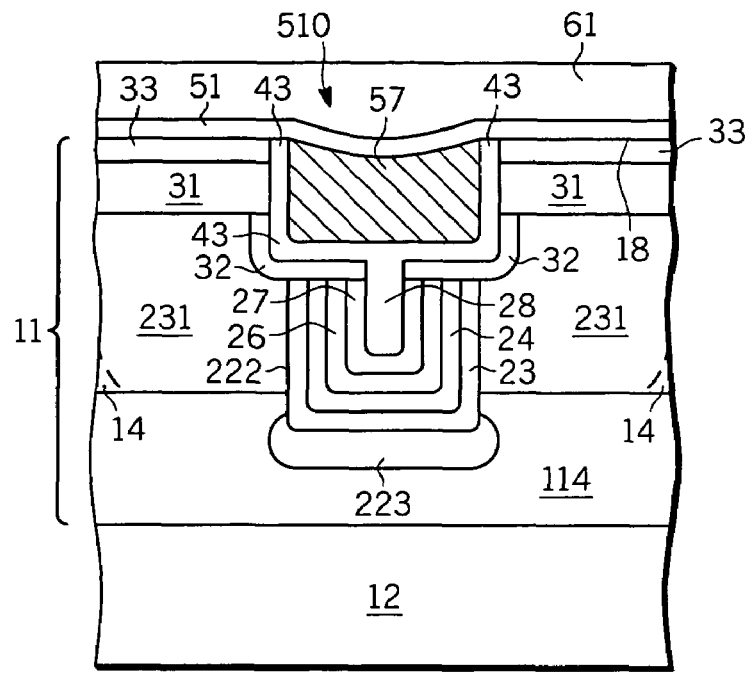
FIG. 12 illustrates a highly enlarged partial cross-sectional view of a portion of a semiconductor device according to another embodiment of the present invention.

FIG. 11 shows an enlarged partial cross-sectional view of device 10 after additional processing. Passivation or dielectric layer 61 is formed overlying major surface 18. By way of example, layer 61 comprises a deposited oxide and has a thickness from about 0.5 microns to about 1.0 microns. A contact photolithography step is used to form openings 91, to expose portions of major surface 18 above source regions 33. An optional isotropic etch is used to widen openings 91 near the outer surface of layer 61 as shown in FIG. 11. Major surface 18 is then exposed to an etchant that removes material from semiconductor layer 14 to form recessed regions 99. Next, body contact regions 36 are formed through openings 91 and recessed regions 99. In one embodiment, a series of implants or a chain of implants are used so that body contact regions 36 comprise a plurality of regions as shown in FIG. 12. In one embodiment, three boron implants are used with increasing implant energies to provide the tapered shape shown in FIG. 12. That is, a higher ion implant energy provides a deeper and wider region while a lower ion implant energy provides a shallower and narrower region. By way of example, a first implant of boron at dose from about $1.0 \times 10^{14}$ atoms/cm$^2$ to about $1.0 \times 10^{15}$ atoms/cm$^2$ and an energy of about 200 KeV is used, then a second implant of boron at about $1.0 \times 10^{14}$ atoms/cm$^2$ to about $1.0 \times 10^{15}$ atoms/cm$^2$ and an energy of about 100 KeV is used, and then a third implant of boron at about $1.0 \times 10^{14}$ atoms/cm$^2$ to about $1.0 \times 10^{15}$ atoms/cm$^2$ and an energy of 25-30 KeV is used to form region 36. In alternative method, body contact regions 36 are formed prior the formation of dielectric layer 61 using conventional masking techniques. Dielectric layer 61 is then formed and patterned thereafter.

After body contact regions 36 are formed, source contact or conductive layer 63 is formed overlying major surface 18. By way of example, a barrier structure is formed such as titanium/titanium nitride followed by a layer comprising aluminum or an aluminum alloy. The conductive layers are then patterned using conventional photolithographic and etch techniques to form source contact layer 63 as shown in FIG. 1. In one embodiment, a final passivation layer is used overlying source contact layer 63, and comprises a deposited oxide, a deposited nitride or combinations thereof. Device 10 is then thinned, and drain contact layer 13 is formed contacting substrate 12 as shown in and further described in conjunction with FIG. 1.

FIG. 12 shows a highly enlarged partial cross-sectional view of a portion of a semiconductor device 100 having a sub-surface filled compensating trench region 222 according to another embodiment of the present invention. Device 100 similar to device 10 except that body of semiconductor material 11 comprises an n-type substrate 12, an n-type buffer layer 114 that has a lower dopant concentration than substrate 12 (e.g., about 20-35 ohm-cm) and thickness of about 10 microns to about 20 microns. Also, in device 100, sub-surface filled trench compensating region or portion 222 does not extend all the way through buffer layer 114. In this embodiment, after trenches 122 are etched, n-type dopant is introduced through the lower surface of trenches 122 to form an n+ region 223 adjacent a lower surface of trenches 122, which functions to counter-dope p-type layer 23 to electrically connect filled trench 222 to buffer epi layer 114. This embodiment is suitable for manufacturing devices of various breakdown voltages using the same filled trench process. The various breakdown voltages are then achieved using different substrate dopant concentrations and thicknesses with the depth or thickness of connecting region 223 being adjusted accordingly. Additionally, device 100 is shown without thick dielectric layer or region 431. In this embodiment, gate dielectric layer 43 separates gate conductive layer 57 from channel connecting regions 32. It is understood that thick dielectric layer 431 may be used with device 100 as well.

Figure 13:
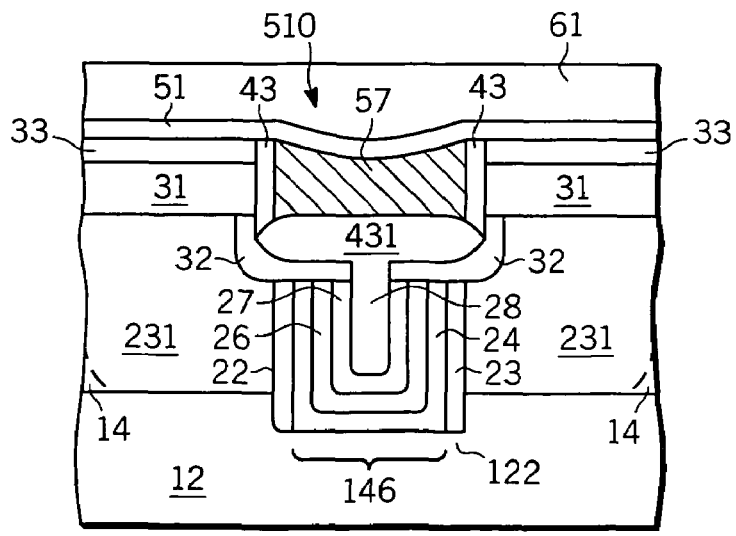
FIG. 13 illustrates a highly enlarged partial cross-sectional view of a portion of a semiconductor device according to a further embodiment of the present invention.

FIG. 13 shows a highly enlarged partial cross-sectional view of a portion of a semiconductor device 110 having a filled compensating trench region according to a further embodiment of the present invention. Device 110 is similar to device 10 except that after p-type layer 23 is deposited, that portion of p-type layer 23 along bottom portion 146 of trench 122 is removed to provide an enhanced conduction path between substrate 12 and n-type layer 26.

In summary, a new switching structure having a filled trench structure that includes a sub-surface charge compensation region and a control region overlying the compensation region. In one embodiment, a channel connect regions are used to electrically connect source regions or current carrying electrodes of the device to the sub-surface charge compensation regions when the device is in operation.

Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

We claim:

1. A semiconductor device comprising:
   a region of semiconductor material having a first major surface;
   a body region formed in the region of semiconductor material;
   a source region formed in the body region;
   a trench gate structure including a gate conductive layer separated from sidewalls of the trench gate structure by a gate dielectric layer, wherein the body region and source region are in proximity to the trench gate structure, and wherein the trench gate structure is configured to control a channel in the body region when the semiconductor device is in operation;
   a sub-surface trench compensation region formed in the region of semiconductor material and recessed below the first major surface, wherein the subsurface trench compensation region is adjacent a lower surface of the trench gate structure, and wherein the subsurface trench compensation region comprises a plurality of opposite conductivity type semiconductor layers, and wherein sidewalls of the subsurface trench compensation region adjoin the region of semiconductor material without an intervening dielectric layer; and
   a channel connecting region formed in the region of semiconductor material interposed between the body region and the subsurface trench compensation region and configured to electrically couple the channel to at least one of the plurality of opposite conductivity type semiconductor layers, wherein the channel connecting region and the source region comprise a first conductivity type, and wherein the channel connecting region overlies at least a portion of the plurality of opposite conductivity type semiconductor layers.

2. The device of claim 1 wherein the region of semiconductor material and the body region comprise the same conductivity type.

3. The device of claim 1 wherein the region of semiconductor material and the body region comprise opposite conductivity types.

4. The device of claim 1 wherein the sub surface trench compensation region is filled with a plurality of single crystal epitaxial layers including:
   a first layer of a first conductivity type formed overlying sidewalls and a lower surface of the trench; and
   a second layer of a second and opposite conductivity type formed overlying the first layer.

5. The device of claim 4 further comprising a first buffer layer formed between the first and second layers, wherein the buffer layer has a lower dopant concentration than the first and second layers when deposited.

6. The device of claim 4 further comprising a dielectric region overlying the second layer.

7. The device of claim 6, wherein the dielectric region comprises a thermal oxide layer overlying the second layer, a polysilicon layer overlying the thermal oxide layer, and a deposited oxide overlying the polysilicon layer.

8. The device of claim 1 further comprising a doped region extending laterally from the subsurface trench compensation region into the region of semiconductor material and below the body region, wherein the doped region and the body region comprise a first conductivity type.

9. The device of claim 1, wherein the region of semiconductor material comprises a semiconductor substrate and a semiconductor layer formed overlying the semiconductor substrate and having a lower dopant concentration than the semiconductor substrate.

10. The device of claim 9, wherein the sub-surface trench compensation region extends through the semiconductor layer into the semiconductor substrate.

11. The device of claim 9, wherein the sub-surface trench compensation region terminates within the semiconductor layer, and wherein the device further comprises a doped region formed between a lower surface of the subsurface trench compensation region and the semiconductor substrate and configured to electrically couple the sub-surface trench compensation region to the semiconductor substrate when the device is in operation.

12. The device of claim 1 further comprising a second dielectric region separating a lower portion of the trench gate structure from the sub-surface trench compensation region, wherein the second dielectric region has a thickness greater than that of the gate dielectric layer.

13. A semiconductor device comprising:
   a region of semiconductor material having a first major surface;
   a filled trench structure formed in the region of semiconductor material including:
      a charge compensating portion recessed below the first major surface, wherein the charge compensating portion includes a first layer of a first conductivity type and a second layer of a second conductivity type overlying the first layer, and wherein the first layer adjoins the region of semiconductor material along sidewall portions that are absent dielectric material; and
      a control portion formed overlying the charge compensating portion;
   a body region of the first conductivity type formed in the region of semiconductor material adjacent the filled trench structure, wherein the control portion is configured to create a channel within the body region when the device is in operation;
   a source region formed in the body region; and
   a first doped region of the second conductivity type formed in the region of semiconductor material and configured to electrically couple the channel to the charge compensating portion when the device is in operation, wherein the first doped region overlies at least a portion of the first and second layers.

14. A semiconductor device comprising:
   a trench control structure formed in a region of semiconductor material, wherein the trench control structure includes a control electrode for forming a channel in a body region formed along a sidewall of the trench control structure;
   a source region formed in the body region;
   a charge compensation structure abutting a lower surface of the trench control structure, wherein the charge compensation structure comprises a plurality of opposite conductivity layers overlying sidewall and lower surfaces of the charge compensation structure, and wherein the charge compensation structure is formed without an intervening dielectric layer between the region of semiconductor material and plurality of opposite conductivity type layers; and
   a doped region formed in the region of semiconductor material electrically coupling the channel to the charge compensation structure, wherein the doped region and the source region comprise the same conductivity type, and wherein the doped region overlies at least a portion of the plurality of opposite conductivity type semiconductor layers.

15. The device of claim 14, wherein the trench control structure further includes a first dielectric layer having a first thickness along the sidewall separating the control electrode from the region of semiconductor material, and wherein the device further includes a second dielectric layer having a second thickness isolating the charge compensation structure from the control electrode.

16. The device of claim 15, wherein the second thickness is greater than the first thickness.

17. The device of claim 14, wherein the charge compensating portion includes a first layer of a first conductivity type and a second layer of a second conductivity type overlying the first layer.

18. The device of claim 17, further comprising a dielectric layer formed overlying the second layer.

19. The device of claim 14, wherein at least a portion of the control electrode is recessed below a major surface of the region of semiconductor material.

* * * * *